(12) United States Patent
Klauk et al.

(10) Patent No.: US 7,151,275 B2
(45) Date of Patent: Dec. 19, 2006

(54) REDUCING THE CONTACT RESISTANCE IN ORGANIC FIELD-EFFECT TRANSISTORS WITH PALLADIUM CONTACTS BY USING NITRILES AND ISONITRILES

(75) Inventors: Hagen Klauk, Erlangen (DE); Guenter Schmid, Hemhofen (DE); Ute Zschieschang, Erlangen (DE); Marcus Halik, Erlangen (DE); Efstratios Terzoglu, Erlangen (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/020,191

(22) Filed: Dec. 27, 2004

(65) Prior Publication Data
US 2005/0133782 A1 Jun. 23, 2005

Related U.S. Application Data

(63) Continuation of application No. PCT/DE2003/001794, filed on Jun. 2, 2003.

(30) Foreign Application Priority Data
Jun. 27, 2002 (DE) .................. 102 28 772

(51) Int. Cl.
 *H01L 21/335* (2006.01)
(52) U.S. Cl. .................. 257/40; 257/642; 257/E39.007
(58) Field of Classification Search .................. 257/40, 257/642, E39.007
See application file for complete search history.

(56) References Cited

U.S. PATENT DOCUMENTS

| | | | |
|---|---|---|---|
| 5,596,208 A * | 1/1997 | Dodabalapur et al. | 257/66 |
| 6,060,338 A * | 5/2000 | Tanaka et al. | 438/99 |
| 6,107,117 A * | 8/2000 | Bao et al. | 438/99 |
| 6,335,539 B1 * | 1/2002 | Dimitrakopoulos et al. | 257/40 |
| 6,344,662 B1 * | 2/2002 | Dimitrakopoulos et al. | 257/40 |
| 6,646,285 B1 * | 11/2003 | Kagan et al. | 257/40 |
| 6,940,092 B1 * | 9/2005 | Yoshida et al. | 257/40 |
| 2001/0043043 A1 | 11/2001 | Aoyama et al. | |
| 2003/0102471 A1 * | 6/2003 | Kelley et al. | 257/40 |

FOREIGN PATENT DOCUMENTS

WO WO 0101502 A2 1/2001

OTHER PUBLICATIONS

Brown, A. et al., "Organic N-Type Field-Effect Transistor", Synthetic Materials, Oct. 1994, pp. 257-261, 0379-6779, Lausanne, CH.
Garnier, F. et al, "Tunneling At Organic/Metal Interfaces in Oligomer-Based Thin-Film Transistors", Mrs. Bulletin, Jun. 1997, pp. 52-56, Pittsburgh, US.

(Continued)

*Primary Examiner*—Eugene Lee
(74) *Attorney, Agent, or Firm*—Edell, Shapiro & Finnan, LLC

(57) ABSTRACT

A semiconductor device includes a semiconductor section formed from an organic semiconductor material, a first contact for injecting charge carriers into the semiconductor section and a second contact for extracting charge carriers from the semiconductor section, wherein a layer of a nitrile or of an isonitrile is arranged between the first contact and the semiconductor section and/or between the second contact and the semiconductor section. The nitrile or isonitrile acts as a charge transfer molecule facilitating the transfer of charge carriers between contact and organic semiconductor material. This allows the contact resistance between contact and organic semiconductor material to be significantly reduced.

6 Claims, 2 Drawing Sheets

OTHER PUBLICATIONS

Gundlach, D. et al., Pentacene TFT With Improved Linear Region Characteristics using Chemically Modified Source And Drain Electrodes, IEEE Electron Device Letters, Dec. 2001, pp. 571-573, New York, US.

Klauk, H. et al, "Contact Resistance in Organic Thin Film Transistors", 2001 International Semiconductor Devcice Research Symposium. Symposium Proceedings (Cat. No. 01EX497), Dec. 2001, pp. 349-352, Piscataway, New Jersey, US.

* cited by examiner

REDUCING THE CONTACT RESISTANCE IN ORGANIC FIELD-EFFECT TRANSISTORS WITH PALLADIUM CONTACTS BY USING NITRILES AND ISONITRILES

CROSS-REFERENCE TO RELATED APPLICATIONS

This application is a continuation of PCT Application No. PCT/DE2003/001794, filed on Jun. 2, 2003, and titled "Reduction in the Contact Resistance in Organic Field Effect Transistors with Palladium Contacts by the Use of Nitriles and Isonitriles", which claims priority under 35 U.S.C. §119 from German Patent Application No. DE 102 28 772.4, filed on Jun. 27, 2002, and titled "Reducing The Contact Resistance In Organic Field-Effect Transistors With Palladium Contacts By Using Nitriles and Isonitriles," the entire contents of which are hereby incorporated by reference.

FIELD OF THE INVENTION

The invention relates to a semiconductor device having a semiconductor section formed from an organic semiconductor material, a first contact for injecting charge carriers into the semiconductor section and a second contact for extracting charge carriers from the semiconductor section, and to a method for fabricating a semiconductor device of this type.

BACKGROUND

Semiconductor chips are in widespread use in numerous technical applications. However, they are still very complex and expensive to produce. Although silicon substrates can be thinned to very low layer thicknesses, so that they become flexible, these methods are likewise very expensive, and consequently flexible or curved microchips are suitable only for demanding applications for which increased costs are acceptable. The use of organic semiconductors offers the possibility of inexpensive production of microelectronic semiconductor circuits on flexible substrates. One application is, for example, a thin film with integrated control elements for liquid crystal displays. A further application area is transponder technology, where, for example, information on a product is stored on what are known as tags.

Field-effect transistors are used as switches in electronic circuits. In this context, a semiconductor which is arranged between a source electrode and a drain electrode, each composed of an electrically conductive material, in the off state of the transistor in each case acts as an insulator, whereas in the on state of the transistor, under the influence of the field of a gate electrode, a charge carrier channel is formed. In this state, electrical charge carriers are injected into the semiconductor layer at the source contact and extracted from the semiconductor layer at the drain contact, so that an electric current flows through the semiconductor layer or through the charge channel generated in the semiconductor layer from source to drain.

On account of the different Fermi levels of semiconductor material and contact material, an asymmetric diffusion process of the charge carriers occurs at the contact surface between the two materials. The different energy of the Fermi levels of the two materials means that there is an energy difference which is compensated for by the transfer of charge carriers. Consequently, an interfacial potential is built up, which counteracts the transfer of charge carriers between the two layers when an external potential difference is applied. The result is the formation of a potential barrier which the charge carriers have to overcome when they enter the semiconductor material from the electrically conductive contact or leave the semiconductor material to pass into the electrically conductive contact. The higher or wider the potential barrier, the lower the tunneling current which is formed as a result of the charge carriers tunneling through the potential barrier. A low tunneling current corresponds to a high contact resistance. In the case of semiconductor components based on inorganic semiconductors, an increase in the contact resistance is combated by doping the inorganic semiconductor in a boundary layer oriented toward the contact surface. The doping changes the energy of the Fermi level in the inorganic semiconductor, i.e., the difference between the Fermi levels of contact material and semiconductor material is reduced. Consequently, either the potential barrier is reduced, allowing a significantly greater number of charge carriers to overcome the potential barrier and flood the opposite material, or the potential barrier is narrowed, with the result that the probability of charge carriers tunneling through the potential barrier is increased. In both cases, the contact resistance is reduced.

When fabricating field-effect transistors based on amorphous or polycrystalline silicon layers, the doping of the contact regions is effected by the introduction of phosphorus or boron into the silicon layer in the vicinity of the source and drain contacts. The phosphorus or boron atoms are incorporated in the silicon network and act as charge donors or charge acceptors, with the result that the density of free charge carriers and therefore the electrical conductivity of the silicon increases in the doped region. This reduces the difference between the Fermi levels of the contact material and the doped semiconductor material. The doping substance is introduced into the silicon only in the region of the source and drain contacts, but not in the channel region, in which a charge carrier channel is formed under the influence of the field of the gate electrode. Since phosphorus and boron form covalent bonds with the silicon, there is no risk of these atoms diffusing into the channel region, and consequently a low electrical conductivity continues to be ensured in the channel region.

If the doping of the contact regions is sufficiently high, the tunneling probability, even in the off state, is so high that the junction between the contact material and the inorganic semiconductor material loses its blocking capacity and acquires good conductivity in both directions.

Field-effect transistors based on organic semiconductors are of interest for a wide range of electronic applications which require extremely low manufacturing costs, flexible or unbreakable substrates, or the fabrication of transistors and integrated circuits over large active areas. By way of example, organic field-effect transistors are suitable as pixel control elements in active matrix displays. Displays of this type are usually produced using field-effect transistors based on amorphous or polycrystalline silicon layers. The temperatures of usually more than 250° C. which are necessary for the fabrication of high-quality transistors based on amorphous or polycrystalline silicon layers necessitate the use of rigid and therefore breakable glass or quartz substrates. On account of the relatively low temperatures at which transistors based on organic semiconductors are fabricated, normally of less than 100° C., organic transistors allow the production of active matrix displays using inexpensive, flexible, transparent, unbreakable polymer sheets with considerable advantages over glass or quartz substrates.

A further application area for organic field-effect transistors is the production of very inexpensive integrated circuits as are used, for example, for the active marking and identification of goods and products. These transponders, as they are known, are usually produced using integrated circuits based on single-crystal silicon, which leads to considerable costs with regard to the build-up and connection technology. The production of transponders based on organic transistors would lead to huge cost reductions and could help transponder technology to make a worldwide breakthrough.

One of the main problems of using organic field-effect transistors is the relatively poor electrical properties of the source and drain contacts, i.e. the high contact resistances thereof. The source and drain contacts of organic transistors are usually produced using inorganic metals or with the aid of conductive polymers, in order thereby to ensure the highest possible electrical conductivity of the contacts. Most organic semiconductors which are suitable for use in organic field-effect transistors have very low electrical conductivities. For example, pentacene, which is frequently used for the fabrication of organic field-effect transistors, has a very low electrical conductivity of $10^{-14}\,\Omega^{-1}\,cm^{-1}$. If the organic semiconductor has a low electrical conductivity, therefore, there is a considerable difference between the Fermi levels of electrically conductive contact material and organic semiconductor material at the contact surface. This leads to the formation of a high potential barrier with a low tunneling probability for the transfer of charge carriers. Consequently, source and drain contacts often have high contact resistances, which means that high electric field strengths are required at the contacts in order to inject and extract charge carriers. Therefore, it is not the conductivity of the contact itself which is a limiting factor, but rather the low conductivity of the semiconductor regions adjoining the contacts, into or from which the charge carriers are injected or extracted.

To improve the electrical properties of the source and drain contacts, therefore, a high electrical conductivity of the organic semiconductor is desirable in the regions adjoining the contacts, in order to reduce the difference in the Fermi levels between organic semiconductor and contact material and thereby to lower the contact resistances. On the other hand, a high electrical conductivity of the organic semiconductor in the channel region has an adverse effect on the properties of the transistor. A significant electrical conductivity in the channel region inevitably leads to high leakage currents, i.e. to relatively high electric current intensities in the off state of the field-effect transistor. For many applications, however, low leakage currents in the range from $10^{-12}$ A or below are imperative. Moreover, a high electrical conductivity leads to the ratio between the maximum on current and minimum off current being too low. Many applications require the highest possible ratio between on current and off current, in the range of $10^7$ or above, since this ratio reflects the modulation performance and the gain of the transistor. In the channel region, therefore, a low electrical conductivity of the organic semiconductor is required, whereas in the region of the source and drain contacts a high electrical conductivity is required in order to improve the contact properties between organic semiconductor material and the material of the contacts.

The electrical conductivity of many organic semiconductors, like that of inorganic semiconductors, can be increased by the introduction of suitable doping substances. However, there are problems with achieving positional selectivity during doping. The doping substances in the organic semiconductors are not bonded to one specific position and can move freely within the material. Even if the doping process can originally be restricted to a certain region, for example the regions around the source and drain contacts, the doping substances subsequently migrate through the entire organic semiconductor layer, in particular under the influence of the electric field applied between the source contact and drain contact in order to operate the transistor. The diffusion of the doping substance within the organic semiconductor layer inevitably increases the electrical conductivity in the channel region.

I. Kymissis, C.D. Dimitrakopoulos and S. Purushothaman, "High-Performance Bottom Electrode Organic Thin-Film Transistors" IEEE Transactions on Electron Devices, Vol. 48, No. 6, Jun. 2001, p. 1060–1061, describe a semiconductor device with a reduced contact resistance, in which first of all a monomolecular layer of 1-hexadecanethiol is applied to chromium/gold electrodes, and then a layer of pentacene as organic semiconductor material is applied to the layer of 1-hexadecanethiol. This arrangement makes it possible to significantly lower the contact resistance for the transfer of charge carriers between electrode and semiconductor section. The 1-hexadecanethiol molecules arranged at the interface between contact and organic semiconductor act as charge transfer molecules. They are in direct contact both with the contact material and with the organic semiconductor layer. On account of their molecular structure, the charge transfer molecules can impose a transfer of charge carriers between the contact material, in which there is an excess of charge carriers, and the organic semiconductor layer, in which there is a deficit of charge carriers. In this way, an excess of charge carriers in the organic semiconductor layer can be produced in the region of the source and drain contacts, with the result that the contact resistance is significantly reduced. The thiol groups of the 1-hexadecanethiol form a covalent bond with the surface of the gold contacts, which effects local fixing of the molecules. Therefore, even under the influence of a field applied between source electrode and drain electrode, the charge transfer molecules do not migrate into those portions of the organic semiconductor section in which the channel region is formed.

However, gold has the drawback that it generally bonds very poorly to inorganic layers, such as for example silicon dioxide. To improve the bonding of the gold contacts, therefore, a thin film of chromium or titanium as bonding agent is often applied directly prior to the deposition of the gold layer. However, this has the drawback of making the patterning of the metal layer required for the production of the contact structures more difficult. Furthermore, thiols are also unsuitable as charge transfer molecules since it is not possible to achieve a sufficient bonding strength with all metals suitable for the production of contacts to prevent the thiols from diffusing out of the boundary layer between contact and semiconductor material.

SUMMARY

Therefore, it is an object of the invention to provide a semiconductor device having a semiconductor section formed from an organic semiconductor material, a first contact for injecting charge carriers into the semiconductor section and a second contact for extracting charge carriers from the semiconductor section, which has a low contact resistance for the transfer of charge carriers between contact and semiconductor section.

The object is achieved in a semiconductor device of the abovementioned type by a molecular layer of a nitrile or an isonitrile being arranged between the first contact and the semiconductor section and/or between the second contact and the semiconductor section.

Nitriles and isonitriles can form complexes with a large number of metals which are used as material for contacts in the semiconductor devices described above. If the nitrile or isonitrile is applied to the surface which subsequently forms the contact surface with the semiconductor section, therefore, the molecules are coordinated so as to form a complex at the surface. This on the one hand ensures good contact with respect to the material of the contacts and on the other hand ensures that the molecules are fixed to the contact surface, so that in a field applied between source electrode and drain electrode they do not diffuse into those portions of the semiconductor section in which the conduction channel is formed.

The term semiconductor section denotes a conduction section between two contacts, which is composed of an organic semiconductor material. The charge carriers, electrons or holes, are injected into the semiconductor section at the first contact, pass through the semiconductor section and are extracted again from the conductor section at the second contact. The organic semiconductor material used may inherently be all organic materials which have semiconductor properties. Examples of suitable compounds include condensed aromatics, such as anthracene, tetracene or pentacene, polymeric aromatic compounds, such as polyvinylenes or polynaphthalene derivatives, electrically semiconducting compounds based on polythiophene, for example poly-3-hexyl-thiophene-2,5-diyl, or electrically semiconducting compounds based on polyvinylthiophene or polyaniline. In addition to the compounds listed, it is also possible to use other organic semiconductor compounds. The organic semiconductor materials may have a doping, for example camphorsulfonic acid or polystyrenesulfonic acid. However, the doping should diffuse only to a small extent or should preferably not diffuse at all in the semiconductor. The semiconductor section may homogeneously consist of just one organic semiconductor material. However, it is also possible to provide a semiconductor section which comprises various portions each composed of different organic semiconductor materials.

The materials used to produce the semiconductor section of the semiconductor device according to the invention are readily accessible and can in some cases even be procured from commercial suppliers. The organic semiconductor materials or precursors for the production of the organic semiconductor materials are generally readily soluble in organic solvents and can therefore be provided in dissolved form or as a suspension and applied to a substrate in liquid form. In this way, the semiconductor section of the semiconductor device according to the invention can be produced, for example, by simple printing processes, which significantly simplifies and reduces the costs of production of the semiconductor element. However, the organic semiconductor material can also be deposited using other processes, for example by application of the semiconductor material by sublimation from the gas phase.

Suitable materials for the contacts are all materials which have a sufficiently high electrical conductivity. In principle, all metals are suitable, preferably palladium, gold, platinum, nickel, copper, aluminum, and also electrically conductive oxides, such as for example ruthenium oxide and indium tin oxide, as well as electrically conductive polymers, such as polyacetylene or polyaniline.

The first contact and/or the second contact of the semiconductor device is preferably built up from palladium. Palladium, like gold, is distinguished by an excellent resistance to oxidation and is likewise easy to deposit and pattern. Compared to gold, however, palladium bonds significantly more successfully to all types of substrates, which means that the additional use of a bonding agent, such as chromium or titanium, is not necessary. Nitriles and isonitriles are distinguished by very good bonding to palladium surfaces, so that there is no migration of these compounds in the electric field. Thiols are unsuitable for fixing to palladium, since the palladium-sulfur bond is significantly weaker than the gold-sulfur bond and there is no local fixing of the molecules on the contact surface.

To achieve the lowest possible contact resistance for the transfer of charge carriers between contact and semiconductor section, the layer of the nitrile or isonitrile should be made as thin as possible. It is preferable for the layer of the nitrile or isonitrile to be formed as a self-organizing molecular layer. In this case, the surface of the contact is covered with a monomolecular layer, with the nitrile group or isonitrile group bonding to the surface of the contact. When the surface of the contact is fully covered, no further compound is adsorbed and excess nitrile or isonitrile can be rinsed away, for example using a suitable solvent.

Isonitriles effect the formation of a positive partial charge at the surface of the contact. This allows the contact resistance to be significantly reduced. Both aromatic and saturated isonitriles are suitable, the aromatic compounds preferably comprising 6 to 10 carbon atoms. Individual hydrogen atoms on the carbon skeleton may also be replaced by substituents, such as for example alkyl groups. Alkyl isocyanides preferably comprise 3 to 10 carbon atoms, and the alkyl chain may be straight-chain or branched. Isocyanides with cycloalkyl radicals are also suitable for reducing the contact resistance. In both the aromatic isocyanides and the saturated isocyanides, individual carbon atoms may be replaced by heteroatoms, such as nitrogen or oxygen. Examples of isonitriles which are suitable for the semiconductor device according to the invention include 2,4-diisocyanotoluene, ethyl isocyanoacetate, 4-(2-isocyanoethyl) morpholine, n-butyl isocyanide, tert-butyl isocyanide, cyclohexyl isocyanide, 1-(isocyanidomethyl)-1H-benzotriazole, 2-methylpropyl isocyanide, phenyl isocyanide dichloride, 1,1,3,3-tetramethylbutyl isocyanide, 4-toluenesulfonylmethyl isocyanide.

However, isocyanides are generally very difficult to synthesize. Consequently, it is preferable to use nitrites for the semiconductor device according to the invention. The most significant reduction in the contact resistance is achieved if the nitrile used is an aromatic nitrile compound. An aromatic nitrile compound is to be understood as meaning a compound which, in addition to the nitrile group, has at least one aromatic radical, which is preferably derived from a phenyl group. In this context, the simplest representative of this class, namely benzonitrile, is particularly preferred. Benzonitrile, by bonding to the surface of the contact, can form a positive partial charge which can be delocalized in the benzyl radical. A very stable system is obtained in this way. The bonding of the nitrile to the surface of the contact can in this case be effected both via the nitrogen atom of the nitrile group and at the side via the n system of the nitrile group. Possible bonding mechanisms and the delocalization of the positive charge are schematically indicated below.

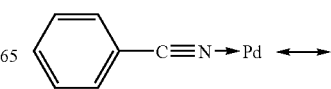

-continued

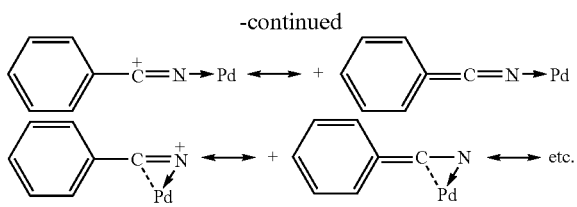

In addition to benzonitrile, by way of example substituted benzonitriles are also suitable for bringing about the reduction in the contact resistance which is observed in the semiconductor device according to the invention. The substituents on the phenyl ring may be varied within wide boundaries. By way of example, substitution by alkyl groups or also by halogen atoms or pseudo-halides is possible. By way of example, o-fluorobenzonitrile, p-fluorobenzonitrile, perfluorobenzonitrile or tetracyanoquinodimethane are suitable.

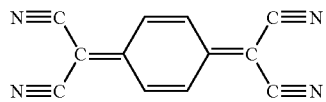

Tetracyanoquinodimethane

Furthermore, it is also possible for one or more of the carbon atoms of the phenyl ring to be replaced by heteroatoms, in particular by nitrogen atoms. Examples of suitable compounds include 2-cyanopyridine or 4-cyanopyridine.

In addition to the aromatic nitriles, aliphatic nitriles are also suitable for bringing about the reduction in the contact resistance observed in the semiconductor device according to the invention. In the case of aliphatic nitrites, however, the effect is generally less pronounced than in the case of aromatic nitrites. Examples of suitable compounds include acetonitrile, valeronitrile or tetracyanoethylene.

Hydrocyanic acid (HCN) and the iso-electronic carbon monoxide (CO) are likewise suitable.

The semiconductor arrangement according to the invention can be very easily be integrated in more complex components. For example, in a particularly preferred embodiment the semiconductor device described above is supplemented by a gate electrode and a gate dielectric to form a transistor. The first contact of the semiconductor device then forms the source contact, while the second contact forms the drain electrode. Then, a charge channel, in which charge carrier transfer takes place, is formed between source electrode and drain electrode under the influence of the field generated by the gate electrode. For the gate electrode, it is possible to use the same materials as those described above for the first contact and the second contact. Standard materials can be used for insulating the gate electrode, for example silicon dioxide, aluminum oxide or an insulating polymer, such as polystyrene, polyethylene, polyester, polyurethane, polycarbonate, polyacrylate, polyimide, polyether, polybenzoxazoles or mixtures of these compounds and their derivatives.

The semiconductor element according to the invention can be produced at very low cost from readily accessible materials and is therefore suitable in particular for use in equipment which is subject to a high pressure on costs, such as for example labels for marking goods.

Therefore, the invention also relates to a process for producing the semiconductor device described above, in which a first contact and/or a second contact, which has an uncovered contact surface, is provided on a substrate. A nitrile or an isonitrile is applied to the uncovered contact surface, so that a layer of the nitrile or isonitrile is obtained on the contact surface. Finally, an organic semiconductor material is deposited in such a manner that a semiconductor section made from the organic semiconductor material is obtained between first contact and second contact.

The substrate used in the production of the semiconductor device according to the invention may be inflexible substrates, such as for example carriers made from glass or quartz or also silicon wafers. However, it is preferable to use flexible substrates, such as for example plastic sheets of, for example, polystyrene, polyethylene, polyester, polyurethane, polycarbonate, polyacrylate, polyimide, polyether or polybenzoxazoles or also paper. It is also possible for components of the semiconductor device, such as for example a gate electrode which is insulated with a corresponding gate dielectric, already to have been defined on the substrate. Then, the first contact and the second contact are defined on the substrate, using standard methods for deposition and patterning. The metal from which the contacts are built up may, for example, be deposited by electron beam vapor deposition or by sputtering. However, it is also possible to use other processes. The metal layer is then patterned, for example by photolithographic methods. The nitrile or isonitrile is then applied to the contacts; it is fundamentally possible to use any desired process to do this. For example, the nitrile or isonitrile can be applied from the vapor phase by an airstream saturated with the nitrile or isonitrile being passed over the surface of the contacts, so that the nitrites or isonitriles are bonded to the surface of the contact. However, it is preferable for the nitrile or isonitrile to be applied to the contacts in the form of a solution. For this purpose, first of all a solution of the nitrile or isonitrile in a suitable solvent is prepared, and this solution is then applied to the contacts. Diffusion causes the molecules to migrate from the solution to the surface of the contacts, where the molecules are bonded via their nitrile or isonitrile group. Excess solvent and nitrile or isonitrile can then be removed, for example by rinsing or centrifuging. The solution of the nitrile or isonitrile can be applied to the contacts using standard processes. Examples of suitable processes include spraying or dipping processes. The solution of the nitrile or isonitrile can also be spun onto the surface of the substrate and of the contacts, in which case the nitrites or isonitriles are selectively bonded to the surface of the metallic contacts. Finally, it is also possible for the nitrites or isonitriles to be applied to the contacts by means of a printing process. After the contacts have been printed with the solution of the nitrile or isonitrile, excess solvent then has to be removed, for example by evaporation. In order not to make the layer of the nitrile or isonitrile too thick, corresponding dilute solutions have to be used. Finally, the organic semiconductor is deposited, so as to produce a semiconductor section between the first and second contacts. Standard processes are likewise used for this purpose. By way of example, pentacene can be deposited by sublimation in vacuo. However, it is also possible to apply the organic semiconductor in dissolved form. For this purpose, the solution of the organic semiconductor can, for example, be sprayed or spun on. It is also possible to apply the organic semiconductor by printing techniques.

In the embodiment of the method described above, first of all the contacts were deposited, and then, following a treatment with nitrites or isonitriles, the layer of the organic semiconductor material was applied to them. It would inherently also be possible for the layer of the organic semiconductor material to be deposited first and then for the contacts to be defined thereon. In general, however, it is difficult to pattern the contacts when they are arranged on the layer of the organic semiconductor material. This has an adverse effect on the conductivity of the organic semiconductor layer and on the reproducibility of the properties of the semiconductor devices produced. Consequently it is preferable to produce the contacts first and only subsequently to deposit the organic semiconductor material on the contacts in order in this way to define the organic semiconductor section.

BRIEF DESCRIPTION OF THE DRAWINGS

The invention is explained in more detail below with reference to an appended drawing, in which identical subjects are denoted by identical reference numerals. In the drawings.

DETAILED DESCRIPTION

Figure 1A:
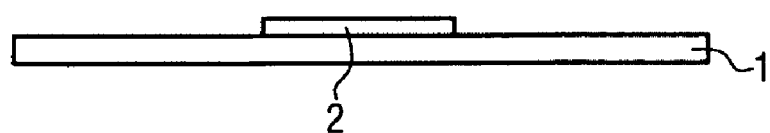
FIGS. 1A–1E shows method steps which are passed through in the fabrication of a field-effect transistor which comprises the semiconductor device according to the invention.
Figure 1B:
Figure 1C:
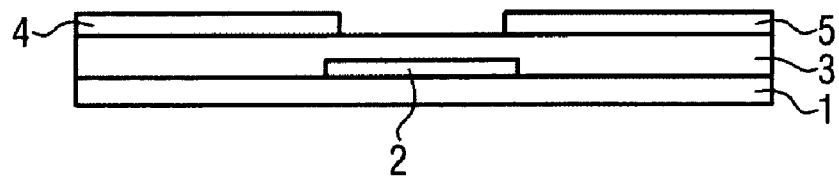
Figure 1D:
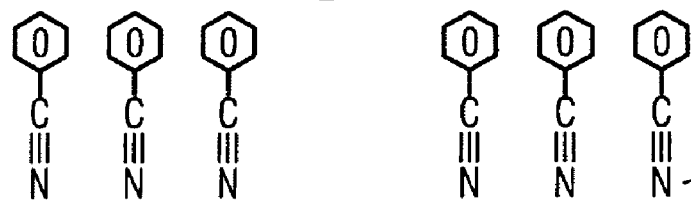
Figure 1E:
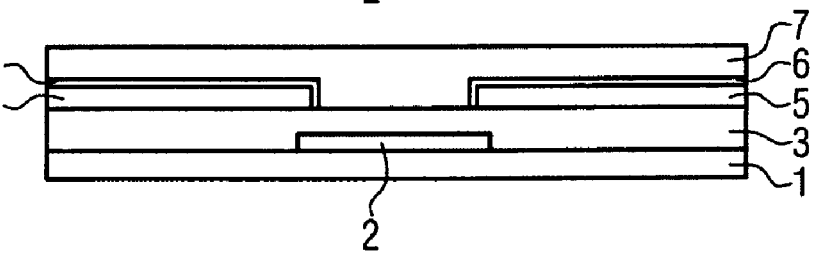

FIGS. 1A–1E show a sequence of the method steps which are passed through in the fabrication of a field-effect transistor which comprises the semiconductor device according to the invention. First, as shown in FIG. 1A, a gate electrode 2 is defined on a substrate 1. For this purpose, a layer of, for example, palladium is deposited on the substrate 1, for example a polymer sheet, and then patterned by photolithographic techniques. The gate electrode 2 is then insulated by a layer of, for example, silicon dioxide being applied as gate dielectric 3. This results in the arrangement illustrated in FIG. 1B. Next, the source electrode 4 and the drain electrode 5 are defined on the gate dielectric 3. For this purpose, as described in connection with the production of the gate electrode 2, first, a layer of, for example, palladium is deposited, and this layer is then patterned by photolithographic techniques in order, as illustrated in FIG. 1C, to obtain portions of palladium which correspond to the source electrode 4 and the drain electrode 5. Then, a solution of benzonitrile in a suitable solvent is applied to the surface formed from the surfaces of the source electrode 4, the drain electrode 5 and the gate dielectric 3, and the solution is left there for a certain period of time, so that the benzonitrile molecules can diffuse out of the solution to the uncovered surfaces of the source electrode 4 and drain electrode 5, where they are bonded. Finally, excess solvent and unbonded benzonitrile are removed, for example by rinsing with a suitable solvent and then drying, for example with a stream of nitrogen. The result, as illustrated in FIG. 1D, is an arrangement in which benzonitrile molecules are bonded to the surfaces of the source electrode 4 and the drain electrode 5 to form a monomolecular layer 6. Finally, as illustrated in FIG. 1E, a layer of an organic semiconductor 7 is applied, covering the source and drain electrodes (4, 5), which have been provided with the monomolecular layer 6, and the portion of the gate dielectric 3 arranged between these electrodes.

EXAMPLE

A flexible polyethylene naphthalate sheet is cleaned using acetone and isopropanol, and then a thin layer of titanium is deposited on the sheet. The titanium layer is patterned by photolithography and wet-chemical etching in dilute hydrofluoric acid in order to define the gate electrodes of the transistors. Then, a thin layer of silicon dioxide as gate dielectric for the transistors is deposited by sputtering and patterned by photolithography and wet-chemical etching. Next, palladium is deposited, either by thermal evaporation, by electron beam vapor deposition or by sputtering, and is likewise etched by photolithography and wet-chemical etching in a highly dilute mixture of hydrochloric acid and nitric acid in order to define the source and drain contacts of the transistors. The substrate which has been prepared in this way is immersed in a 5% strength solution of benzonitrile in xylene for 5 minutes in order to cover the palladium surfaces with a monolayer of benzonitrile. Excess benzonitrile is rinsed off in a rinsing step with hexane. After drying of the substrate, a thin layer of pentacene as organic semiconductor layer is deposited by means of thermal evaporation.

Figure 2:
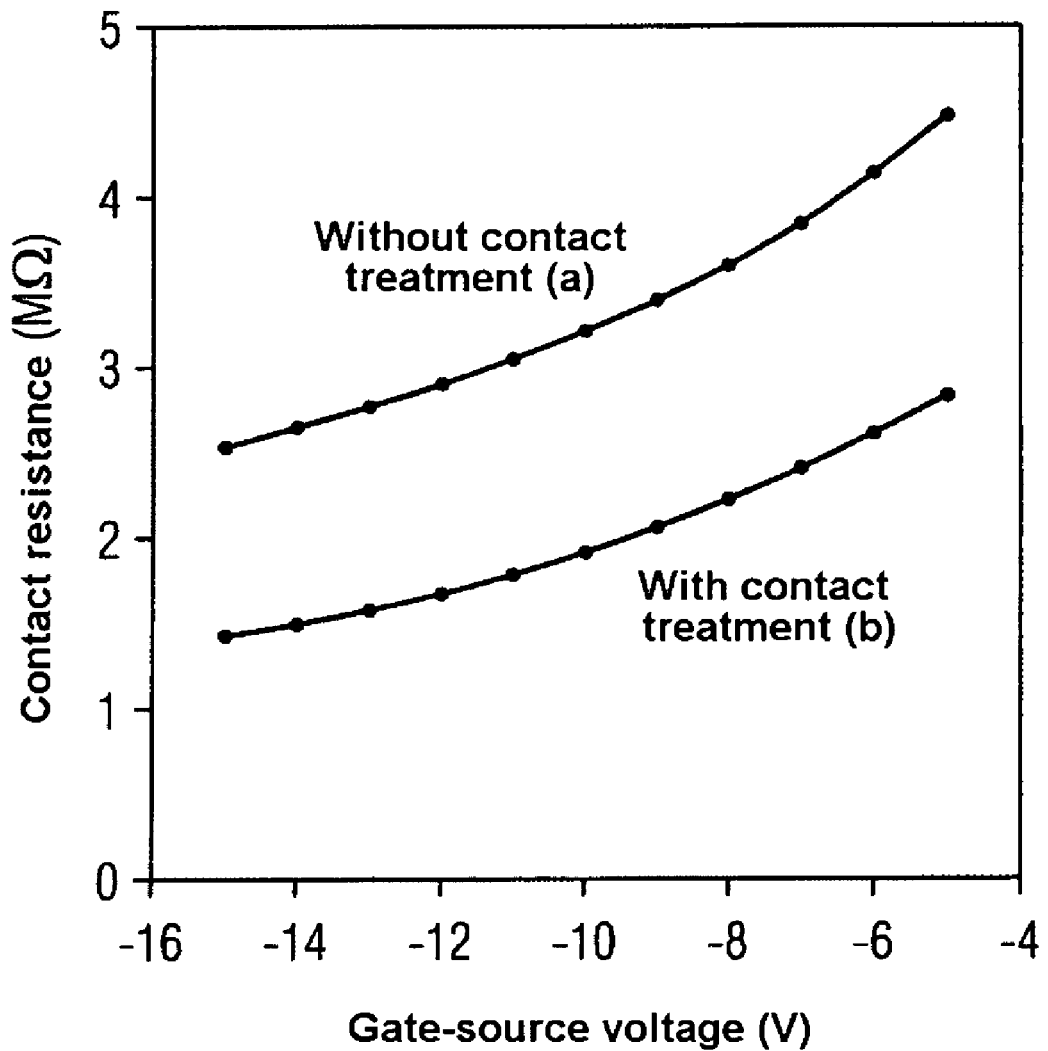
FIG. 2 shows a graph illustrating the contact resistance as a function of a voltage applied between gate and source for two different field-effect transistors.

As a comparison, the same working steps were carried out, but without the palladium surfaces being covered with benzonitrile. Then, the resistance of the two transistor arrangements was measured as a function of the voltage applied between source and drain. The measurement curves obtained are illustrated in FIG. 2. In FIG. 2, curve a denotes the change in the resistance for the transistor whose contacts were not treated with benzonitrile, while curve (b) shows the change in the contact resistance for a transistor whose source and drain electrodes were treated with benzonitrile. Treating the palladium contacts with benzonitrile makes it possible to reduce the contact resistance by approximately a factor of 2.

LIST OF REFERENCE SYMBOLS 1 substrate
2 gate electrode
3 gate dielectric
4 source electrode
5 drain electrode
6 monomolecular layer
7 organic semiconductor

What is claimed is:

1. A semiconductor device, comprising:
   a semiconductor section formed from an organic semiconductor material;
   a first contact to inject charge carriers into the semiconductor section; and
   a second contact to extract charge carriers from the semiconductor section, the first and/or second contact being built up from palladium, wherein a layer of a nitrile or of an isonitrile is arranged between the first contact and the semiconductor section and/or between the second contact and the semiconductor section.

2. The semiconductor device as claimed in claim 1, in which the layer of the nitrile or isonitrile is formed as a self-organizing monomolecular layer.

3. The semiconductor device as claimed in claim 1, in which the nitrile is an aromatic nitrile.

4. The semiconductor device as claimed in claim 1, in which the nitrile is an aliphatic nitrile.

5. The semiconductor device as claimed in claim 1, further comprising a gate electrode and a gate dielectric, wherein the semiconductor device comprises a field-effect transistor.

6. The semiconductor device as claimed in claim 3, in which the aromatic nitrile is a substituted or unsubstituted benzonitrile.

* * * * *

UNITED STATES PATENT AND TRADEMARK OFFICE
CERTIFICATE OF CORRECTION

PATENT NO. : 7,151,275 B2 Page 1 of 1
APPLICATION NO. : 11/020191
DATED : December 19, 2006
INVENTOR(S) : Hagen Klauk et al.

It is certified that error appears in the above-identified patent and that said Letters Patent is hereby corrected as shown below:

Col. 6, line 59:     replace "n system" with -- π system -- (Greek letter)

Col. 7, line 36:     replace "aromatic nitrites" with -- aromatic nitriles --

Col. 7, line 38:     replace "aliphatic nitrites" with -- aliphatic nitriles --

Col. 7, line 40:     replace "aromatic nitrites" with -- aromatic nitriles --

Col. 8, line 44:     replace "nitrites" with -- nitriles --

Col. 8, line 46:     replace "nitrites" with -- nitriles --

Signed and Sealed this

Twentieth Day of November, 2007

JON W. DUDAS
*Director of the United States Patent and Trademark Office*